(12) United States Patent
French

(10) Patent No.: US 6,495,387 B2
(45) Date of Patent: Dec. 17, 2002

(54) ELECTRONIC DEVICES INCLUDING MICROMECHANICAL SWITCHES

(75) Inventor: Ian D. French, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 46 days.

(21) Appl. No.: 09/734,077

(22) Filed: Dec. 11, 2000

(65) Prior Publication Data

US 2001/0004548 A1 Jun. 21, 2001

(30) Foreign Application Priority Data

Dec. 10, 1999 (GB) ............................................. 9929133
Feb. 4, 2000 (GB) ............................................. 0002445

(51) Int. Cl.[7] ............................................. H01L 21/00
(52) U.S. Cl. ............................. 438/52; 458/50; 458/51
(58) Field of Search ............................. 438/50, 51, 52, 438/53

(56) References Cited

U.S. PATENT DOCUMENTS

| 5,611,940 | A | * | 3/1997 | Zettler | 216/2 |
| 5,638,946 | A | * | 6/1997 | Zavracky | 200/181 |
| 6,069,540 | A | * | 5/2000 | Berenz et al. | 200/181 |
| 6,242,843 | B1 | * | 6/2001 | Pohjonen et al. | 310/313 R |
| 6,331,257 | B1 | * | 12/2001 | Loo et al. | 216/13 |

FOREIGN PATENT DOCUMENTS

EP 0679878 A2 11/1995

OTHER PUBLICATIONS

"Electrostatic Polysilicon Microelays Integrated with MOS-FETs" bu M.A. Gretillat et al., in IEEE on Microelectromechanical Systems, 1994, pp. 97–101.

* cited by examiner

Primary Examiner—Kevin M. Picardat
(74) Attorney, Agent, or Firm—Aaron Waxler

(57) ABSTRACT

A method of manufacturing an electronic device comprising an integrated circuit device having micromechanical switches (10) and thin film circuit components (20) provided on a common substrate (2). The micromechanical switches (10) have contact beams (12) extending over a respective sacrificial region. Component layers (5) for forming the thin film circuit components are used as the sacrificial region in the area of the substrate allocated to the micromechanical switches. This enables various layers to be shared between the switches and the components. A supplementary support layer (50) may be provided for the contact beams to protect them against damage during subsequent processing and fabrication stages. A portion of this support layer can be left attached to the beam in the completed device for increased strength.

12 Claims, 6 Drawing Sheets

ELECTRONIC DEVICES INCLUDING MICROMECHANICAL SWITCHES

BACKGROUND OF THE INVENTION

This invention relates to electronic devices, and more especially integrated circuit devices, including micromechanical switches and to their method of manufacture. Particularly, but not exclusively, the invention relates to integrated circuit photodiode arrays, with addressing of the individual photodiodes being controlled by an associated micromechanical switch.

It has been recognised that micromechanical switches can give lower on-resistance and higher off-resistance than conventional semiconductor switching devices, such as transistors or diodes. Different types of micromechanical switch have been proposed, which use either electrostatic or electromagnetic actuation of a moveable beam to perform the switching operation. Known methods for manufacturing the beam of the switch involve deposition of a beam structure having suitable mechanical and electrical properties over a sacrificial support layer. This sacrificial layer is eventually removed to leave a cavity into which the beam is deflected upon application of the actuation signal. The article "Electrostatic Polysilicon Microrelays Integrated with MOSFETs" appearing in Proceedings of the IEEE on Microelectromechanical Systems, 1994, page 97 describes a microrelay comprising a beam supported at both ends with a cavity defined beneath the centre of the beam which is obtained by sacrificial etching of silicon dioxide. This microrelay structure is integrated onto a transistor substrate, so that IC compatibility of the micromechanical device is demonstrated.

A problem with existing methods for manufacturing integrated circuit devices including micromechanical switches is the increased complexity of the manufacturing process resulting from the different components to be integrated onto the device.

SUMMARY OF THE INVENTION

According to the present invention, there is provided a method of manufacturing an integrated circuit device, the device comprising a plurality of micromechanical switches and a plurality of thin film circuit components provided on a common substrate, the method comprising:

depositing and patterning a lower electrode pattern which defines bottom contacts for the thin film circuit components and for the micromechanical switches;

depositing and patterning component layers for forming the thin film circuit components over the lower electrode pattern, the component layers defining sacrificial regions over regions of the substrate allocated to the micromechanical switches and defining the thin film circuit components over regions of the substrate allocated to the thin film circuit components;

depositing and patterning a conductive layer to provide an upper electrode pattern, the upper electrode pattern defining top contacts for the thin film circuit components and defining contact beams for the micromechanical switches, the contact beams each extending over a respective sacrificial region;

removing the sacrificial regions of the component layers to define a space between the contact beam and the lower electrode pattern of each micromechanical switch.

In the method of the invention, the lower and upper electrode patterns are shared between the micromechanical switches and the thin film circuit components, thereby reducing the number of additional processing steps required to form the integrated circuit device. Furthermore, layers defining the thin film circuit components also act as the support for the contact beam of the micromechanical switch. In this way, a region of the component layers defines the sacrificial layer of the micromechanical switch, so that the processing steps required for the thin film circuit components and for the switches are shared to the greatest possible extent.

The thin film circuit components may comprise diodes, for example defining a PIN or NIP diode structure, with an upper electrode layer being provided which overlies and directly contacts the diode structure. These diodes may be formed from amorphous silicon layers, and the resulting diode-switch integrated circuit device may define pixels of an image sensor.

The upper electrode layer may be patterned to define a well in the sacrificial region, so that after removal of the sacrificial region, a contact projection is defined on the underside of the contact beam. This contact projection assists in reducing the on-resistance of the switch.

A support layer may be deposited and patterned over the component layers in the regions of the substrate allocated to the micromechanical switches, to provide mechanical support of the contact beam. This may assist in improving the rigidity of the beam and prevent collapse of the beam during subsequent etching processes or during dicing and packaging of integrated circuit components. The removal of the sacrificial regions is preferably carried out using an etchant which leaves the support layer, so that additional support is provided for the contact beam in the finished product.

BRIEF DESCRIPTION OF THE DRAWINGS

Embodiments of electronic devices, in the form of integrated circuit devices, and their method of manufacture in accordance with the invention will now be described, by way of example, with reference to, and as shown in, the accompanying drawings in which.

DESCRIPTION OF THE PREFERRED EMBODIMENTS

Figure 1A:
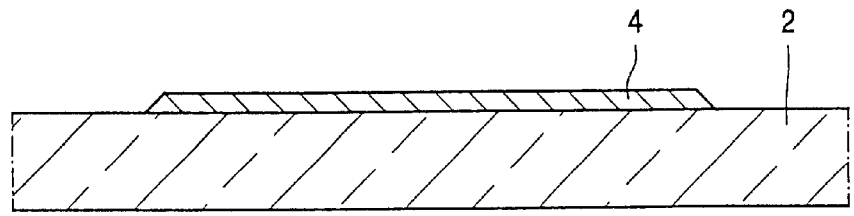
FIG. 1 shows the processing steps required for the manufacture of an integrated circuit diode structure.

It should be understood that the figures are merely schematic and are not drawn to scale. In particular, certain dimensions such as the thickness of layers or regions may have been exaggerated whilst other dimensions may have been reduced. It should also be understood that the same reference numerals are used throughout the figures to indicate the same or similar parts.

Figure 3:
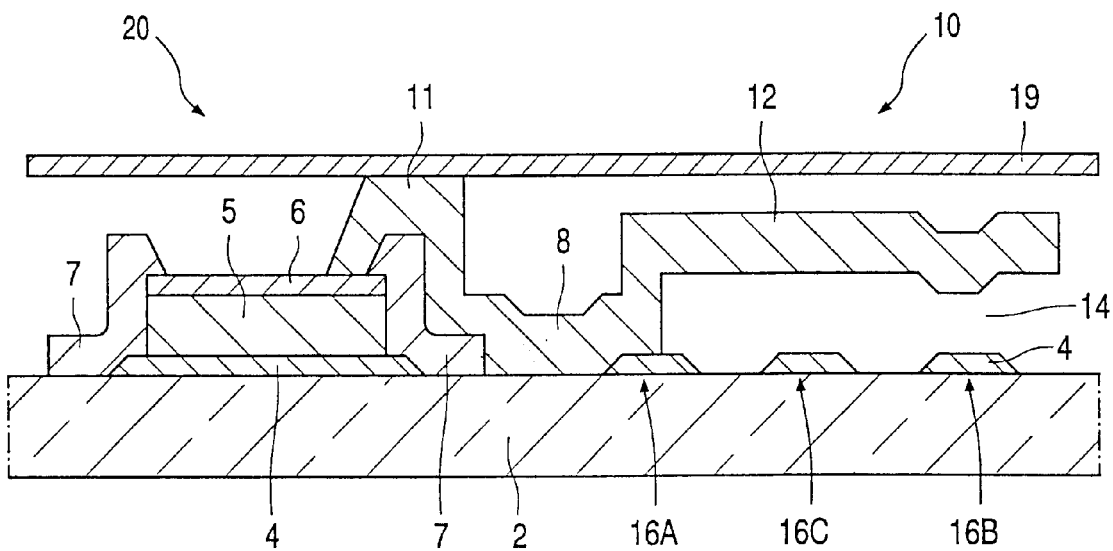
FIG. 3 shows the combination of a diode and a micromechanical switch as laterally adjacent components at one location on the substrate.

This invention is concerned with the integration of micromechanical switches and other thin film electronic circuit components onto a common substrate. In particular, and as shown in FIG. 3, the invention provides a method of manufacturing an electronic device in the form of an integrated circuit device in which a micromechanical switch 10 is provided with a beam 12 which extends over a void 14, the beam 12 being selectively moveable into the void 14 by application of an actuation signal to cause closing of the switch. The beam 12 is deposited over a sacrificial layer which is subsequently removed to form the void 14. The invention provides a method by which a thin film circuit component 20 is defined from layers which not only form the structure of the thin film circuit component 20 but also form the sacrificial layer subsequently removed to form the void 14. By way of example, the invention will be described in the context of an integrated circuit image sensor device which comprises photo-diodes and micromechanical switches carried on a common substrate.

The manufacturing processes involve the deposition and patterning by photolithographic techniques of various conducting, insulating and semiconducting layers on a common substrate. In general terms, such processes are well known, having been employed in the fabrication of large area, thin film, electronic devices comprising arrays of thin film diodes, thin film transistors, and the like carried on insulating substrates.

The manufacturing steps required for forming a thin film photo-diode device will first be described with reference to FIG. 1, which shows the processing steps required to form a stack diode structure. The diode structure itself is of generally conventional form.

Figure 1B:
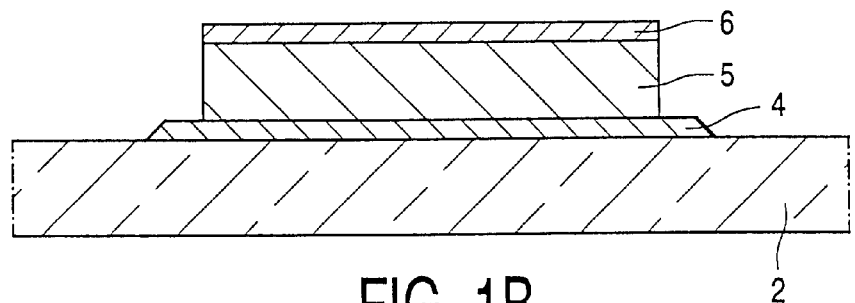

As shown in FIG. 1A a bottom electrically—conductive contact layer 4, preferably of metal, is provided over an insulating substrate 2, for example of glass. The bottom contact layer 4 may comprise a chrome layer which is deposited and patterned using conventional thin film processing techniques. As shown in FIG. 1B semiconductor layers 5 defining the required diode structure are deposited and patterned directly over the bottom contact layer 4, followed by a top electrode layer 6 overlying and in direct contact with the upper surface of the diode structure. The semiconductor layers may be formed from amorphous silicon and may define for example a NIP or PIN structure. Thus, the semiconductor layers 5 comprise three separate layers, a bottom layer of a first dopant type, an intrinsic layer and a top layer of a second, opposite dopant type. The top contact layer may comprise ITO, which is transparent thereby enabling the diode to be responsive to light incident from above. The layers 5 and 6 are patterned together during a single etching step to define the diode structure, as shown in FIG. 1B.

Figure 1C:
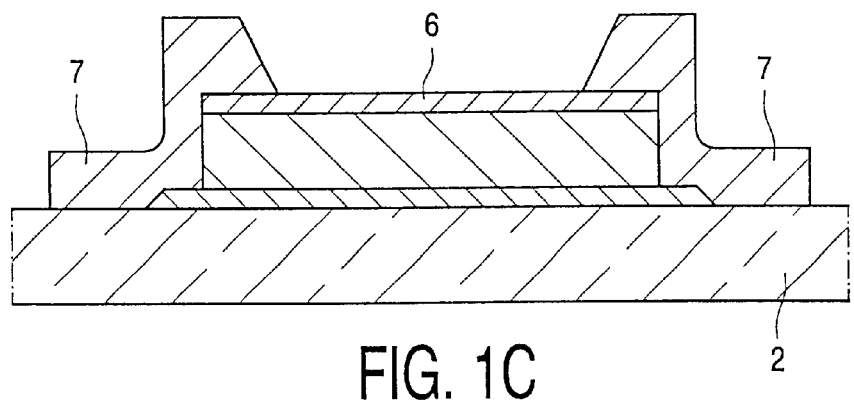

As shown in FIG. 1C a passivation layer 7 of suitable insulating material is then deposited and appropriately patterned to surround the diode structure in order to reduce edge leakage currents at the edges of the diode stack, while leaving at least a substantial part of the area of the upper layer 6 exposed.

This layer 7 may comprise silicon nitride, and is again deposited and patterned using conventional techniques.

Figure 1D:
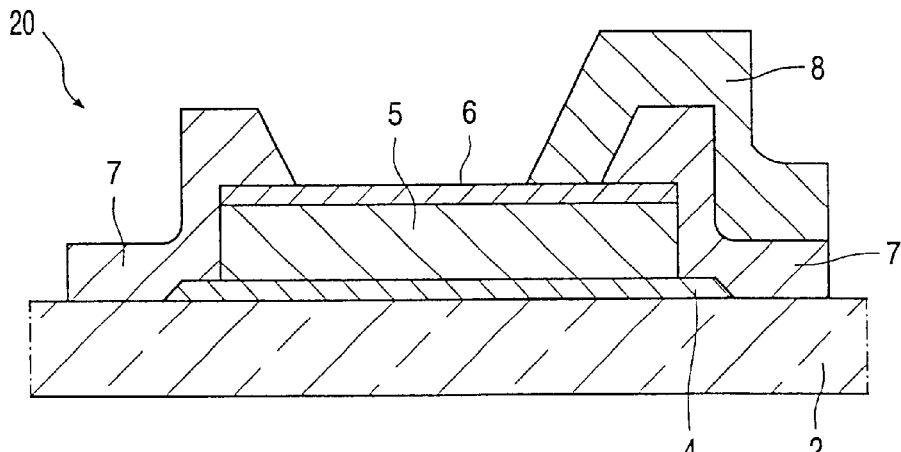

Finally, as shown in FIG. 1D, a top contact layer 8 is deposited and patterned to define the contact to the top of the top electrode of the diode structure. The layer 8 extends over the surface of the passivating layer 7 to electrically contact directly with the exposed surface of the upper electrode 6. This comprises a metal layer, and as will be apparent from the following, the nature of this layer, i.e. composition, thickness, etc, is selected taking into consideration the mechanical and electrical requirements of the micromechanical switches. FIG. 1D shows one completed diode structure, which together with other, simultaneously—formed diode structures, provide the thin film circuit components 20 for integration on a common substrate with micromechanical switches.

It will be appreciated that the techniques used for depositing and patterning the various layers are of known kind as conventionally used in the fabrication of thin film electronic devices on insulating substrates for producing large area electronic devices, and typically entailing the deposition of layer using for example a CVD process or similar and subsequent patterning by a photolithographic process. As such it is not thought necessary to describe these processes here in detail.

FIG. 2 shows the processing steps for the manufacture of the micromechanical switches, when such switches are to be provided integrated on the same substrate as the diodes of FIG. 1. The deposition and patterning of layers carried out in steps A, B and D of FIG. 2 correspond to the deposition and patterning of layers in steps A, B and D of FIG. 1 so that the same layer deposition and patterning processes are involved enabling the diodes and the switches to be conveniently fabricated simultaneously together with appropriate interconnections.

Figure 2A:
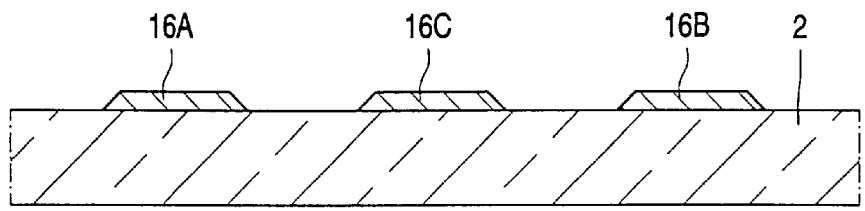
FIG. 2 shows the processing steps of the invention for manufacture of a micromechanical switch to be combined on the same substrate as the diode structure of FIG. 1.
Figure 2B:
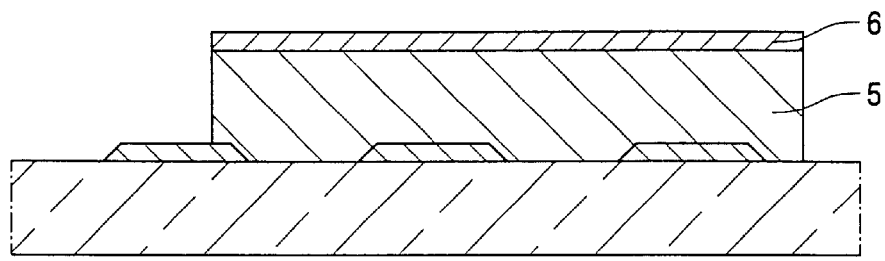
Figure 2C:
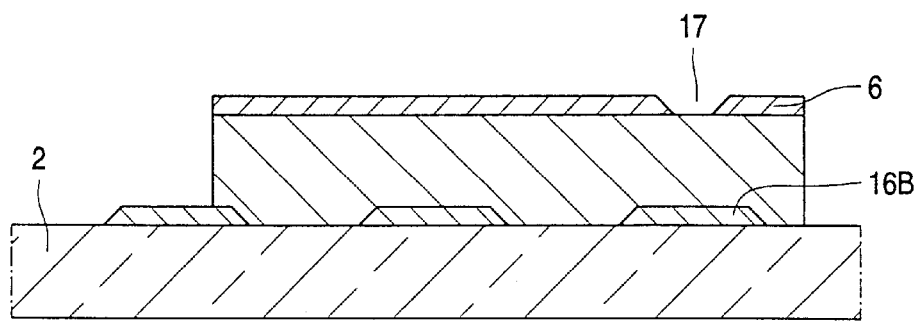
Figure 2D:
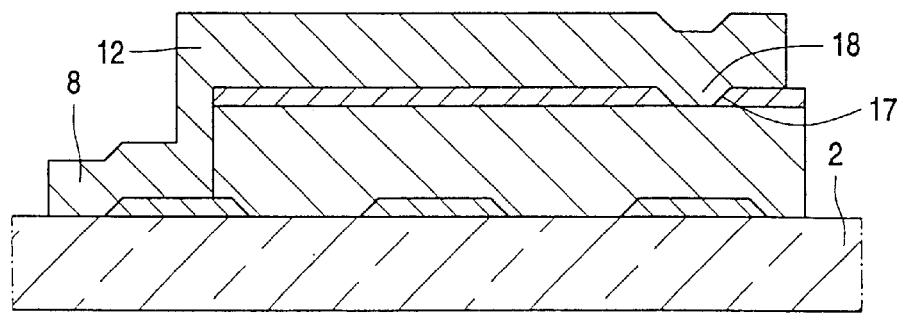

As shown in FIG. 2A, the deposited metal layer constituting the bottom contact layer 4 is patterned also to define the mutually-spaced switch contacts 16A, 16B of the micromechanical switch, as well as the intermediate control electrode 16C. The deposition and patterning of the component layers constituting the diode stack 5, 6 in FIG. 2B forms a sacrificial region at the location of each micromechanical switch extending over the contacts.

FIG. 2 part C1 shows a processing step required only for the micromechanical switches. This step involves etching an opening 17 through the upper electrode layer 6 of the deposited diode layer structure at a region directly overlying one of the switch contacts, namely, the contact 16B. Step C1 of FIG. 2 may proceed or follow step C of FIG. 1. Furthermore, step C of FIG. 1 plays no part in the fabrication of the micromechanical switch structure.

In step D of FIG. 2 the deposited top metal contact layer 8 forms the contact beam 12 when patterned. The region of the top contact layer 8 extending into the well 17 defines a contact projection 18 on the underside of the contact beam 12.

The portions of the layers 5, 6 constituting the sacrificial region at the micromechanical switch location are removed by etching. The structure shown in FIG. 2E results after this etching of the amorphous silicon layers defining the diode structure as well as the top ITO contact layer 6 at this region. Removal of these layers creates the free-space void 14 which enables pivotal movement of the beam 12 around its region overlying the contact 16A to make or break electrical contact between the switch electrodes 16A, 16B, via the layer 8, upon the application or removal of an actuation voltage to the contact 16C.

Figure 2E:
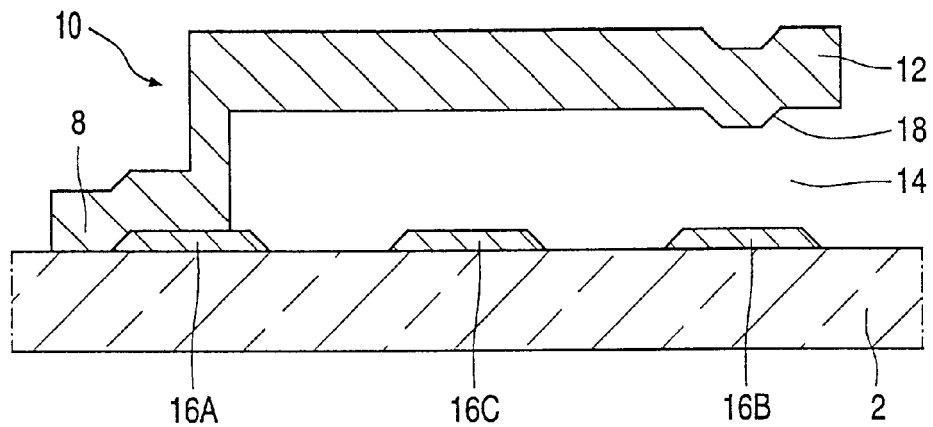

During sacrificial etching, giving rise to the structure shown in FIG. 2E, the layers defining the photodiode 20 are shielded from the etchant employed by means of a suitable photomask. The removal of the sacrificial layer region is preferably performed using wet etching, because the liquid can penetrate into all areas of the void 14. This is also a relatively inexpensive and safe process compared to alternative dry and vapour etching techniques. Of course, the etchant selected must leave the metal contact beam 12 and the electrodes 16 unaffected and is selected accordingly.

The use of an integrated circuit device incorporating diodes and micromechanical switches in an image sensor will now be described. Conventional large area, thin film integrated circuit image sensor arrays using photodiodes comprise arrays of image sensor pixels, in which each pixel comprises a photodiode and an associated switching device in the form of a thin film transistor (TFT) or a switching diode (which is shielded from the incident light).

The micromechanical switches manufactured using the method of the invention are used as the switching elements within an image sensor photodiode array. In this case, each image sensor pixel comprises a photodiode and an associated micromechanical switch for controlling the passage of charge to or from the photodiode to enable addressing of the image sensor array. This is achieved by the photodiode and switch being electrically interconnected through the integrally-formed upper contact 8 and beam 12.

The reduced on-resistance and increased off-resistance which can be achieved using a micromechanical switch enables an increase in the amount of charge stored on the photodiode which can be read out, and thereby enables an increased speed of operation, or a reduction in the so-called memory effect, by which some charge remains on the photodiodes after the read-out period. The use of micromechanical switches also enables a reduction in the output capacitance of the device compared with TFTs or switching diodes further improving the operational performance of the image sensor array. The micromechanical switches also have no photosensitivity, thereby avoiding the need to shield such devices from the incident optical signal.

FIG. 3 shows the thin film diode 20 and the micromechanical switch 10 side-by-side, defining an individual pixel circuit configuration in which the micromechanical switch is connected electrically in series with the photodiode though the metal layer constituting the contact 8 and the beam 12. The same reference numbers are used as in FIGS. 1 and 2 and the sharing of layers between the two devices 10, 20 can easily be recognised. FIG. 3 also shows an optional protective layer 19 for protecting the micromechanical switches 10 in the finished device. This layer 19 may comprise a pre-formed glass microsheet mounted on the flat uppermost surfaces of portions 11 of the top contact layers 8 over the passivation layers 7 which serve as spacers.

In its natural state, the position of the beam 12 of the micromechanical switch is as shown in FIG. 3 so that the contacts 16A and 16B are electrically isolated and the switch is effectively open. When an actuating voltage signal is applied to the electrode 16C the beam 12 is pivoted downward through electrostatic attraction effects so that the protrusion 18 of the beam 12 contacts the electrode 16B, thereby closing the switch and electrically connecting the electrodes 16A and 16B. When the actuating signal is removed, the beam returns to its initial, relaxed, configuration. As a typical example, the beam may be around 20 $\mu$m in length, the gap between the protrusion 18 and electrode 16B in the relaxed state around 1.5 $\mu$m, and the extent of pivotal deflection of the beam around 8 degrees.

Figure 4:
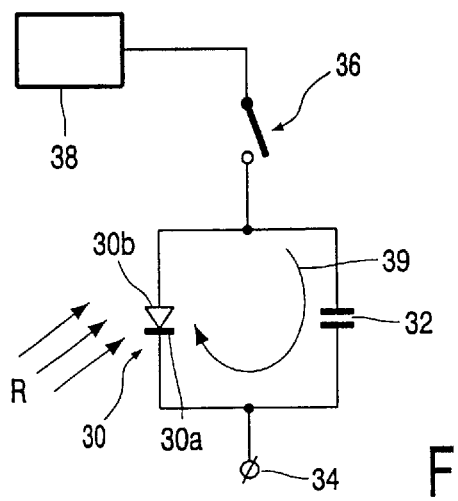
FIG. 4 illustrates the operation of a combined photodiode and micromechanical switch as a pixel element in an image sensor.
Figure 5:
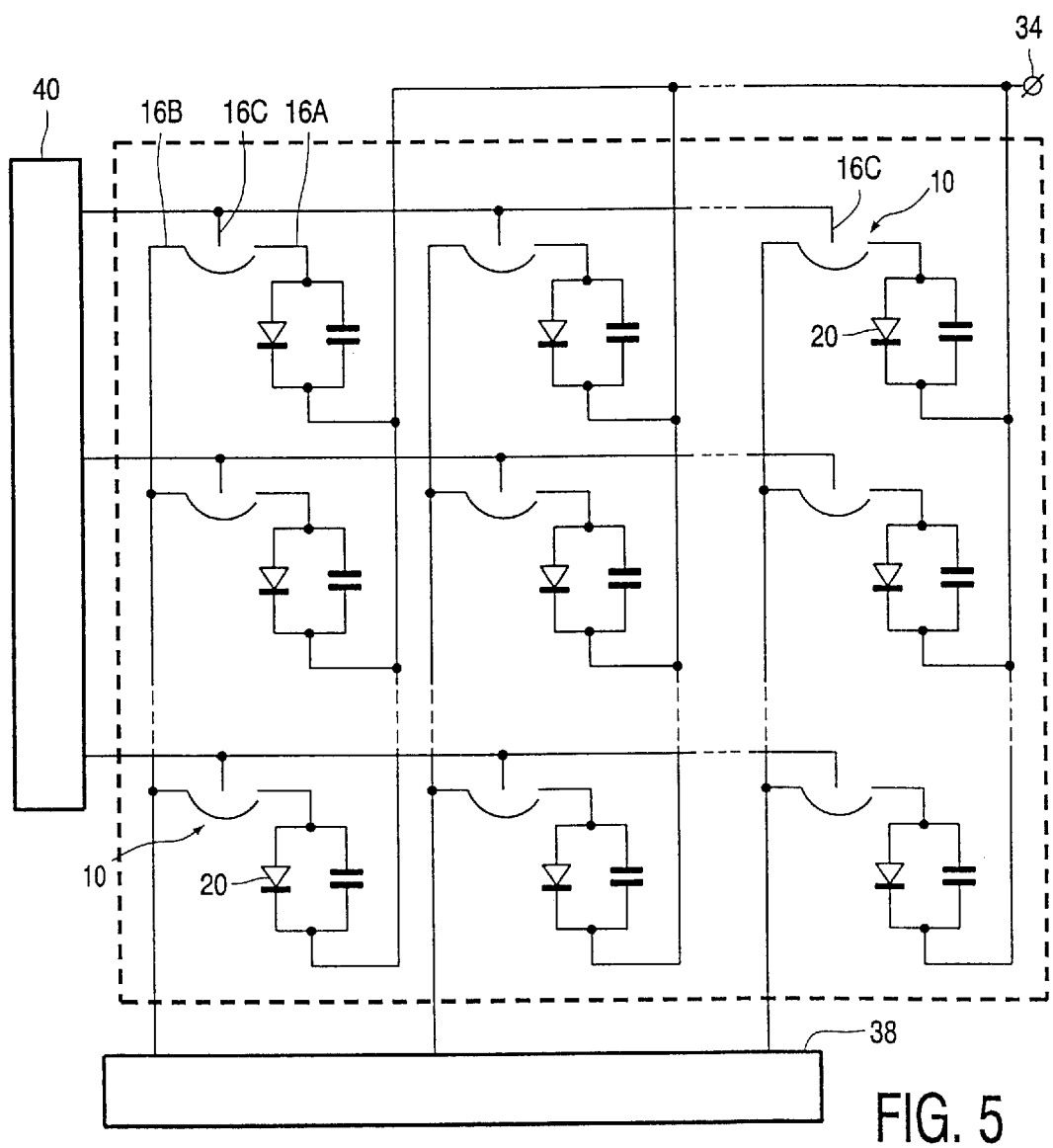
FIG. 5 shows the circuit configuration of an image sensor manufactured in accordance with the method of the invention.

FIGS. 4 and 5 illustrate the use of the diode-switch arrangement of FIG. 3 in an image sensor. FIG. 4 illustrates the basic operational principle of an image sensor using a photodiode as the light sensing element.

As shown in FIG. 4, electromagnetic radiation R is incident upon a photosensitive diode 30, which is responsive to the electromagnetic radiation R, which may comprise visible light. A single photosensitive element is shown in FIG. 4 in parallel with a capacitor 32 which can represent the parasitic or self-capacitance of the diode 30, or may also include an additional capacitor to improve the dynamic range of the detector. The cathode 30a of the diode is connected to a common line 34, whereas the anode 30b of the diode 30 is connected to one terminal of an associated switching element 36. The other terminal of the switch 36 is connected to a readout amplifier 38. The circuit of FIG. 4 represents the component layout for a single image sensor pixel.

One possible drive scheme to enable the circuit of FIG. 4 to provide an output representing the incident light on the photodiode will now be described.

At the beginning of an address period the switch 36 is closed and the capacitor 32 is charged to an initial value determined by the difference between the voltage on the terminal 34 and the voltage provided by the amplifier 38. For example, the terminal 34 may be at five volts whereas the amplifier drives the anode of the photodiode to zero volts. The photodiode capacitor 32 is thereby charged to an initial voltage of five volts, with the photodiode reverse-biased. During a subsequent light sensing operation, the switch 36 is opened so that no current can flow to or from the terminal 34. During this time, light incident on the photodiode 30 results in the production of a minority carrier (photo) current which causes discharge of the capacitor 32 as represented by arrow 39. At the end of the light sensing operation the voltage across the photodiode will have dropped as a function of the intensity of the incident light. In order to measure the amount of voltage drop the switch 36 is again closed and the current flowing from the terminal 34 to recharge the capacitor 32 is measured by the amplifier 38.

There are various alternative pixel configurations and drive schemes which will be apparent to those skilled in the art. Essentially, the switch 36 is required to enable the photodiode to be isolated electrically so that discharge of the photodiode capacitance takes place during a light sensing period.

FIG. 5 shows an implementation of the pixel configuration of FIG. 4 in a large area two-dimensional image sensor array with the micromechanical switches 10 serving as the switches 36. The array comprises rows and columns of individual pixels, each pixel comprising a photodiode 20 and a micromechanical switch 10 electrically in series between a charge sensitive readout amplifier 38 and a common terminal 34 shared by all pixels. Row driver circuitry 40 is provided for generating the actuation signals to be applied to the electrodes 16C of the micromechanical switches in order to open and close the switches. As is conventional, the pixels of the array are addressed a row at a time in sequence. The pixels may typically have a pitch of 200 $\mu$m and the array may have an overall size of up to 400 mm×400 mm to achieve the sort of resolution required where the image detector is to be used for detecting diagnostic x-ray images of areas of a human or animal body. Typically, the array may be a 2,000×2,000 array of pixels, although only a portion of the array is shown in FIG. 5 for clarity. In the case of an x-ray image detector, the electromagnetic radiation R may be supplied from an energy conversion layer (not shown) having as input x-radiation and providing as output visible light which is detected by the diodes. In such a case, the energy conversion layer may be a phosphor layer, for example a layer of thallium-doped caesium iodide.

Apart from the use of micromechanical switches for the pixel active matrix switching function, the array is generally similar in terms of its general manner of operation to known forms of image sensing arrays using photodiodes.

It will be appreciated that the address lines interconnecting the pixels with the circuits 40, 38 and the common terminal 34 are formed from conductive material deposited on the substrate. Thus the switch control electrodes 16C can comprise integral extensions of a set of row address conductors defined from the same deposited metal layer as used for the bottom contact layers 4 of the photodiodes. The sets of column address conductors can similarly be formed from another deposited conductive layer, for example that used to provide the top contact layer 8, by appropriate patterning of that layer with the bottom contacts of the photodiodes having integral extensions that connect with one set and the switch contacts 16B having integral extensions that connect to the other set. Insulating material is provided between the sets of row and column conductors at their crossovers and this may be provided by the material deposited to form the passivating layers 7.

With regard to processing described with reference to FIG. 2 then in some circumstances a problem might be encountered as a result of the wet etching that is used to form the void 14 shown in FIG. 2E. The liquid used in the wet etching process is viscous and this may cause the beam 12 to bend and break when moved in the liquid. Drying can also be a problem, because water used in a cleaning operation is left beneath the beam 12 and tends to form a bead as it gets smaller, during drying, and surface tension can deform the beam. The beam 12 may also suffer physical damage when a large area array of devices is diced and packaged, or interconnects are formed to the edges of the integrated circuit device. Difficulties arise in resolving these problems because the material for the beam 12 must, in addition to being compatible with the large area, thin film, processes used, satisfy as well both electrical requirements to define the electrical characteristics of the switch and mechanical requirements for correct deformation of the beam 12 by the applied actuation signal.

Another embodiment of micromechanical switch and its method of fabrication will now be described with reference to which FIG. 6 illustrates additional method steps in the manufacture of the micromechanical switches directed to solving any such problems. The steps illustrated with reference to FIG. 2 parts A and B are first carried out so as to define the switch area with the patterned sacrificial layer. A support layer 50 of dielectric material is then deposited and patterned over the sacrificial layer of the switch to provide mechanical support for the contact beam. FIG. 6A shows a view in cross section through line A—A in FIG. 6B, which shows a plan view at this stage in the fabrication process. The support layer 50 extends beyond the peripheral edge of the sacrificial layer, herein referenced 52, as can be seen from the plan view. The layer 52 corresponds to the layer 5 in the previous embodiment. The support layer 50 is provided with a series of openings 54 extending completely therethrough and which are positioned away from the intended position of the contact beam but overly the sacrificial layer 52 so as to provide access to the sacrificial layer 52 for the wet etchant, as will be apparent from the following. The support layer 50 is also provided with an additional opening 56 aligned with the contact electrode 16C which is used to form the contact projection 18 described with reference to FIG. 2D.

FIG. 6 part C1 corresponds to FIG. 2 part C1 in which the well 17 is provided in the top contact layer 6, but this time using the support layer 50 as a mask, with etching through the opening 56.

Figure 6A:
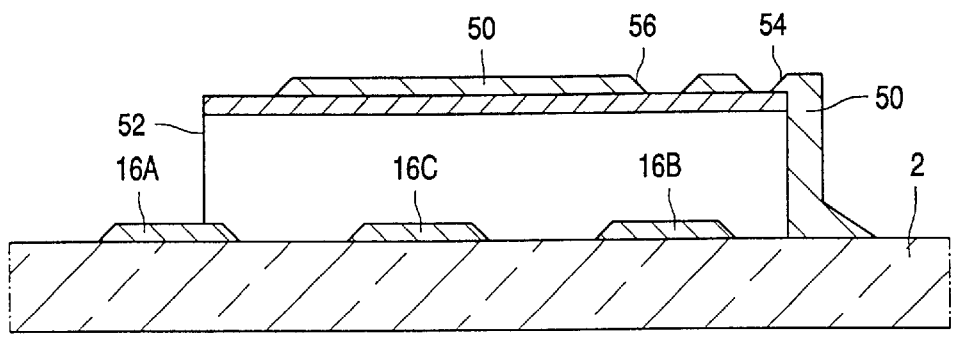
FIG. 6 shows the processing steps in another embodiment of a method of manufacturing an electronic device comprising micromechanical switches and diode structures on a common substrate.
Figure 6B:
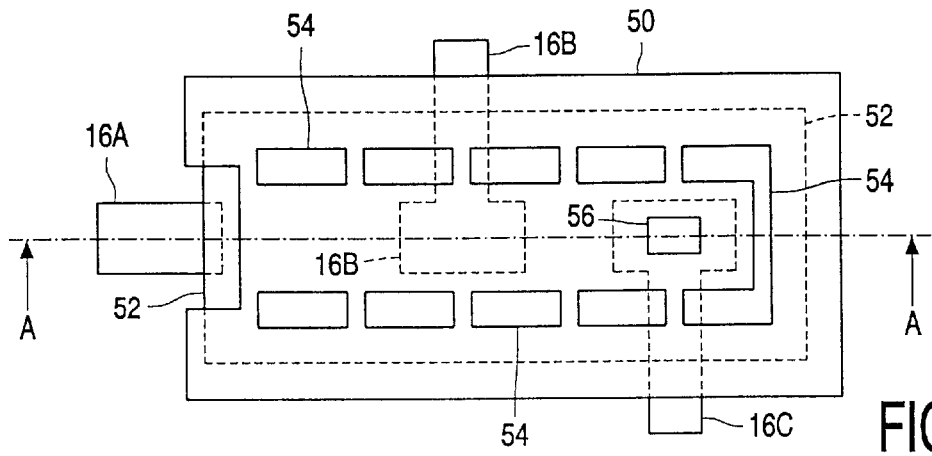
Figure 6C:
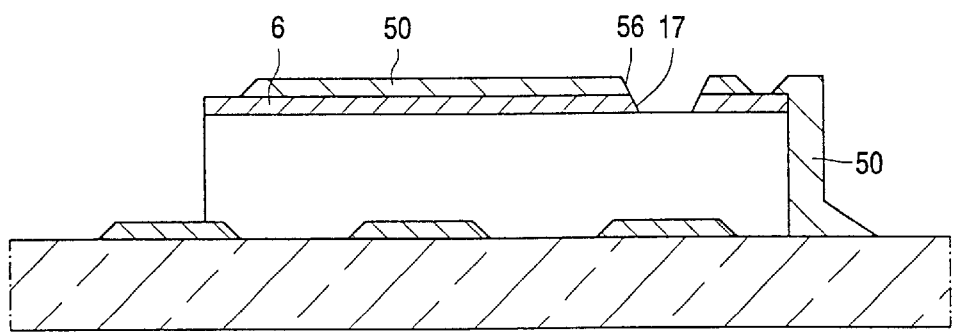
Figure 6D:
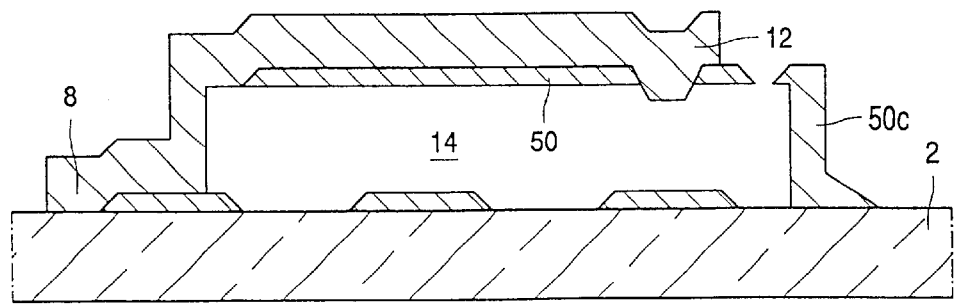
Figure 6E:
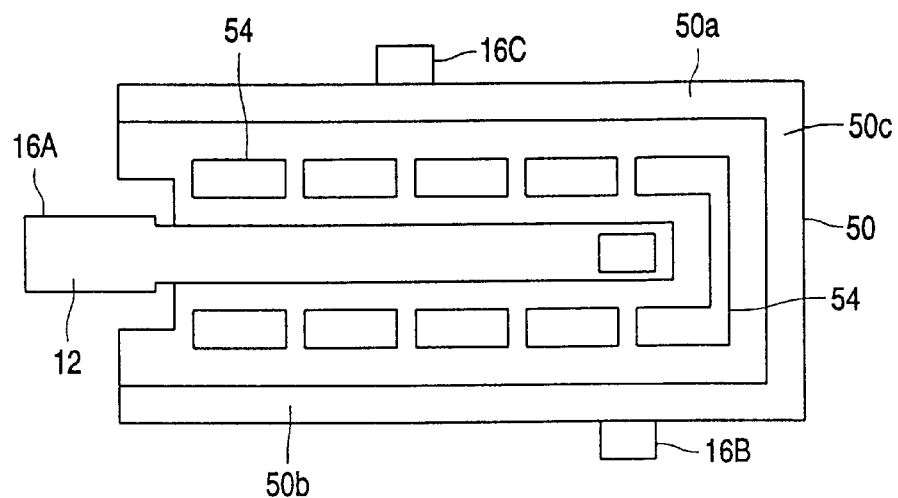

The top contact layer 8 is formed as described previously, and following removal of the sacrificial layer using wet etching the structure shown in FIG. 6D results. The etchant is selected to remove the amorphous silicon layers of the diode structure and the ITO top contact layer constituting the sacrificial layer, but to leave the support layer 50 in place. This support layer preferably comprises silicon nitride which has greater rigidity than the metal of the top contact layer 8. After removal of the sacrificial layer 52, the support layer in effect defines a cradle which supports the contact beam 12. The cradle extends beneath the contact beam 12 and laterally therefrom to a peripheral wall 50 that bridges the void 14 between the contact beam 12 and the substrate 2. As shown in the plan view of FIG. 6E the cradle remains intact at this stage and contacts the substrate along the top and bottom edges 50a, 50b as represented in FIG. 6E as well as along an end edge 50c which can be seen in the cross section of FIG. 6D.

Figure 6F:
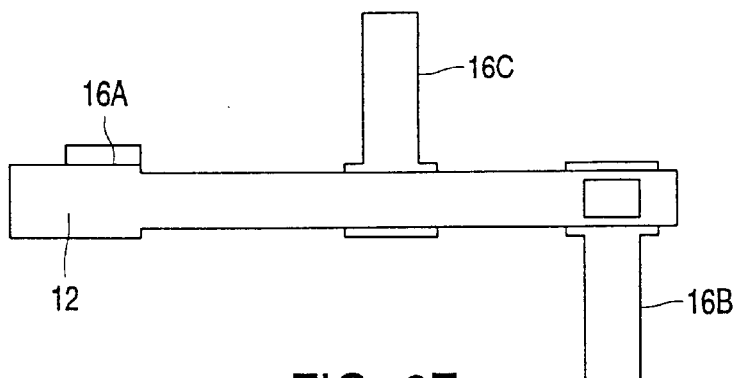
Figure 6G:
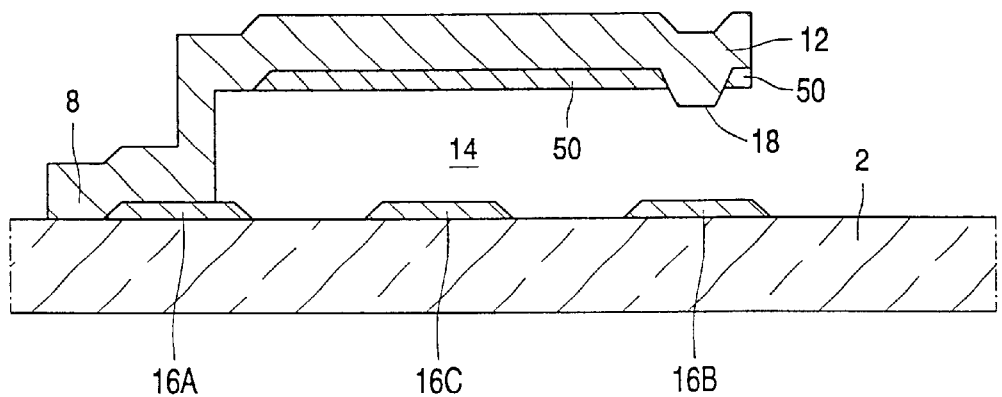

This cradle can remain in place during dicing and packaging of the integrated circuit component and during formation of the interconnections. Alternatively, the cradle can be removed after completion of the wet etching process which removes the sacrificial layer. The cradle can be removed by reactive ion etching with the contact beam 12 acting as a mask. Any material of the support layer 50 lying beneath the contact beam 12 will not be removed by this reactive ion etching process so it can remain directly on the underside of the beam and act as a strengthening layer to provide reinforcement to the beam as well as providing insulation between, for example, the contact beam 12 and the control electrode 16C used for electrostatic actuation. FIG. 6F shows the structure of the micromechanical switch in plan after reactive ion etching of the cradle, and FIG. 6G shows the same structure in cross is sectional view.

Micromechanical switches similar to those associated with the photodiodes may also be used to form switching devices within the row driver circuitry 40 or the charge sensitive amplifier 38, for example as components of a shift register circuit. In this case, these circuits may be integrated on to the same substrate as the image sensor array and fabricated simultaneously with, and in the same manner as, the pixel switches 10 from the same deposited layers. Alternatively or additionally, multiplexing circuitry may be provided between the row driver circuitry 40 and the array of pixels and between the amplifier 38 and the array of pixels. These multiplexer circuits may likewise also be integrated on to the same substrate as the pixels of the array and may again comprise micromechanical switches of the same design.

Although the invention has been described with reference specifically to an image sensor pixel configuration comprising a diode and switch in series, the invention may be applied to many other electronic devices comprising integrated circuit devices. Similarly, although one specific pixel design has been shown for an image sensor many other possibilities will be apparent to those skilled in the art. An image sensor using pixels having photodiodes and micromechanical switches manufactured using the method of the invention may be used, for example, within x-ray image sensors, document scanners or fingerprint sensors, or many other applications where an optical image is to be captured. The method of the invention enables a reduced number of masks to be required in the manufacturing process of the integrated circuit device and improves the performance of that device in comparison with more conventional switch designs.

Various alternatives to the specific materials described in this application will be apparent to those skilled in the art. The deposition and patterning processes have not been described in detail in this application since these aspects will also be apparent to those skilled in the art of thin film integrated circuit design.

What is claimed is:

1. A method of manufacturing an integrated circuit device, the device comprising a plurality of micromechanical switches and a plurality of thin film circuit components provided on a common substrate, the method comprising:

depositing and patterning a lower electrode pattern which defines bottom contacts for the thin film circuit components and for the micromechanical switches;

depositing and patterning component layers for forming the thin film circuit components over the lower electrode pattern, the component layers defining sacrificial regions over regions of the substrate allocated to the micromechanical switches and defining the thin film circuit components over regions of the substrate allocated to the thin film circuit components;

depositing and patterning a conductive layer to provide an upper electrode pattern, the upper electrode pattern defining top contacts for the thin film circuit components and defining contact beams for the micromechanical switches, the contact beams each extending over a respective sacrificial region;

removing the sacrificial regions of the component layers to define a space between the contact beam and the lower electrode pattern of each micromechanical switch.

2. A method as claimed in claim 1, wherein the thin film circuit components comprise diodes.

3. A method as claimed in claim 1, wherein the component layers define a PIN or NIP diode structure and an upper electrode layer.

4. A method as claimed in claim 3, wherein amorphous silicon layers are deposited to define the diode structure.

5. A method as claimed in claim 3, wherein the upper electrode layer is patterned to define a well in the sacrificial region, so that after removal of the sacrificial region, a contact projection is defined on the underside of the contact beam.

6. A method as claimed in claim 1, further comprising depositing a passivation layer around the patterned component layers constituting the thin film circuit components.

7. A method as claimed in claim 1, wherein the upper electrode pattern is patterned to define a cantilevered beam structure for each micromechanical switch.

8. A method as claimed in claim 1, wherein a support layer is deposited and patterned over the component layers in the regions of the substrate allocated to the micromechanical switches to provide mechanical support of the contact beam.

9. A method as claimed in claim 8, wherein the removal of the sacrificial regions is carried out using an etchant which leaves the support layer.

10. A method as claimed in claim 9, wherein following removal of the sacrificial regions, the support layer is further etched using the contact beam as a mask, so as to leave a portion forming a strengthening layer extending directly over the underside of the contact beam.

11. An image sensor comprising an array of pixels, each pixel comprising a photodiode and a micromechanical switch, the image sensor device being manufactured using a method as claimed in claim 1.

12. An image sensor device as claimed in claim 11 for detecting incident X-ray radiation, and including a conversion layer for converting incident X-ray radiation to optical radiation for detection by the photodiodes of the image sensor device.

* * * * *